United States Patent [19]

Levy

[11] Patent Number: 5,042,285

[45] Date of Patent: Aug. 27, 1991

[54] CRIMPING TOOL HAVING IMPROVED CRIMPING DIES

[75] Inventor: Sidney Levy, Belle Mead, N.J.

[73] Assignee: Thomas & Betts Corporation, Bridgewater, N.J.

[21] Appl. No.: 526,421

[22] Filed: May 21, 1990

[51] Int. Cl.⁵ .............................. B25F 1/00
[52] U.S. Cl. ...................... 72/410; 72/416; 7/107
[58] Field of Search ............... 72/410, 416, 412, 470, 72/474, 475; 29/751, 753; 7/107; 81/424.5, 418; 140/106

[56] References Cited

U.S. PATENT DOCUMENTS

| | | | |
|---|---|---|---|
| 2,387,928 | 1/1944 | Monnier | 81/5.1 |
| 3,314,135 | 7/1964 | Smith | 72/410 |
| 4,009,514 | 3/1977 | Couto | 72/410 |
| 4,028,756 | 6/1977 | Couto | 7/5.3 |
| 4,229,849 | 10/1980 | Theiles, Sr. | 7/107 |

Primary Examiner—Lowell A. Larson
Assistant Examiner—M. J. McKeon
Attorney, Agent, or Firm—Robert M. Rodrick; Salvatore J. Abbruzzese

[57] ABSTRACT

A hand tool of the pliers-type configuration used for crimping electrical terminals is disclosed. The tool includes a pair of jaws movably with respect to one another by the actuation of a pair of handles. The jaws define a crimping nest which supports an electrical terminal. One die of the crimping nest includes a raised surface, and depending tapering side walls. The raised surface of the die has an hour-glass configuration. The particular shape of the die limits the pressure applied to the terminal during crimping, so as to reduce the tendency to overcrimp the terminal.

8 Claims, 2 Drawing Sheets

CRIMPING TOOL HAVING IMPROVED CRIMPING DIES

FIELD OF THE INVENTION

The present invention relates to tools used to crimp electrical terminals to electrical wire, and more particularly relates to an improved crimping die of a pliers-type crimping tool which provides the proper pressure for crimping insulated terminals.

BACKGROUND OF THE INVENTION

Pliers-type crimping tools are well-known in the electrical industry as being effective for crimping, electrical terminals to the bared extent of an electrical wire. Tools of this type typically include opposed jaws movably operable by extending handles connected at a pivot point. The opposed jaws include opposed crimping dies between which the electrical terminal is crimped.

One limitation of these simple pliers-type hand tools is that the pressure required to crimp the contact is depended upon manual actuation of the handles by the operator. The crimp force employed is totally dependent upon operator discretion. Variations in operator force could result in undercrimping, which may cause an ineffective connection between the terminal and the bared extent of the wire, or overcrimping, which could result in damage to the terminal. This problem is further compounded by the fact that the die must be able to accommodate various ranges of terminal sizes.

It is desirable to provide a die configuration for a pliers-type crimping tool which would compensate for variations in the crimping force applied to crimp a terminal as among various operators and terminal sizes.

SUMMARY OF THE INVENTION

It is an object of the present invention to provide a tool for crimping an electrical terminal which includes crimping dies, which compensate for variations in operator crimping force.

It is a further object of the present invention to provide a die configuration for a pliers-type crimping tool which would accommodate terminals of various ranges and which would apply an appropriate crimping pressure to the terminal within a range of operator crimping force.

These and other objects are provided in a tool for crimping an electrical terminal. The tool includes a pair of opposed movable jaws which support the terminal therebetween. Handles are supported by the jaws for imparting movement thereto. At least one jaw includes a crimping die for progressively engaging the terminal upon continued movement of the jaws. The die defines an area of surface contact with the terminal such that this area of surface contact progressively increases upon continued movement of the jaw, thereby limiting the deformation of the terminal during crimping.

As shown by way of a preferred embodiment, the present invention provides a pliers-type tool for crimping an insulated electrical terminal, including a first handle having a first jaw at one end, and a second handle having a second jaw at one end. Pivot means movably couples the handles for movable support of the jaws with respect to one another. The jaws each include a crimping die engagable with the insulated terminal. Each crimping die includes a raised surface and depending tapering side walls. The side walls of each raised surface extend in opposite directions. The dies are concave, and the raised surfaces are hour-glass in shape.

DETAILED DESCRIPTION OF THE PREFERRED EMBODIMENT

Figure 2:
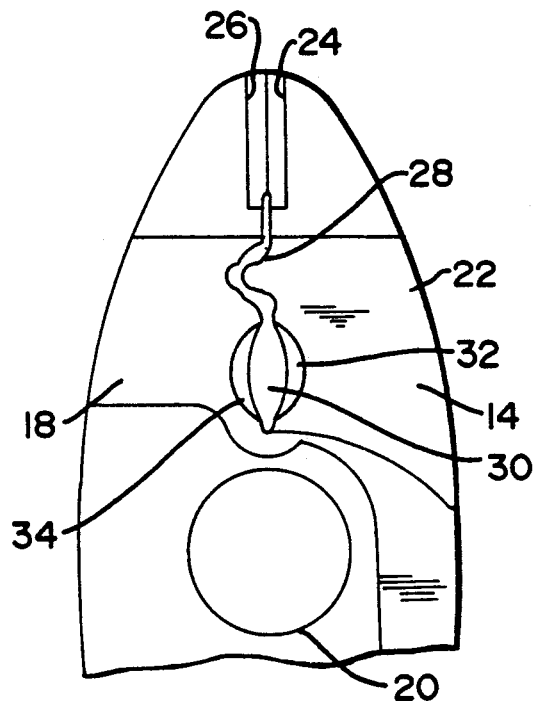
FIG. 2 is an enlarged showing of the jaws of the tool of FIG. 1.
Figure 1:
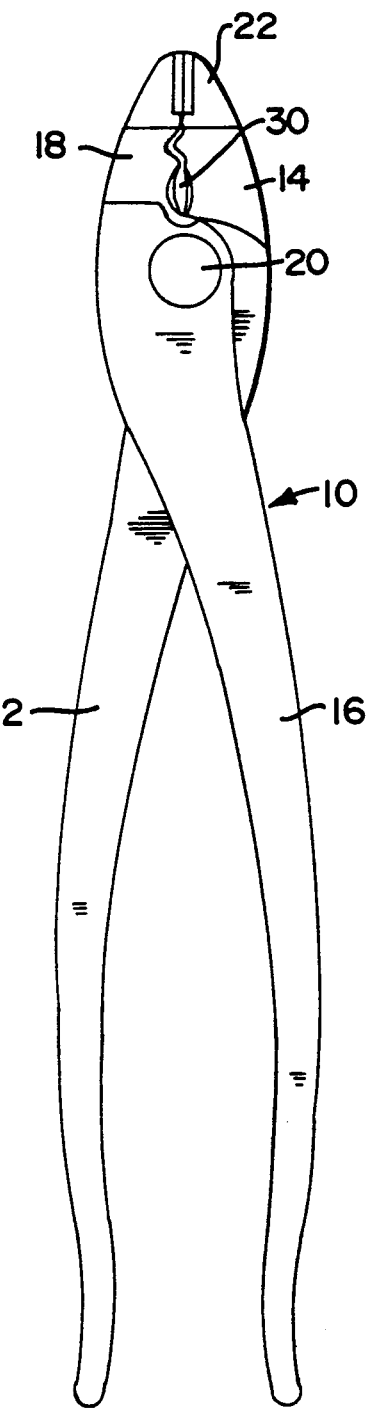
FIG. 1 is a plan view of the pliers-type hand tool of the present invention.

Referring to FIGS. 1 and 2, there is shown a multi-function hand tool 10 constructed in accordance with the present invention. Tool 10 is of the pliers type, having a first elongate handle 12 terminating in a first jaw 14 and a second elongate handle 16 terminating in a second jaw 18. The handles are movably pivotally assembled by a pivot pin 20. Manual actuation of the handles 12 and 16 causes movement of jaws 14 and 18 toward and away from one another in conventional pliers-type movement. The forward nose 22 of tool 10, shown in enlarged view in FIG. 2, comprises jaws 14 and 18. Nose 22 includes opposed cutting blades 24 and 26 at the distal end thereof, which may be used to cut and strip electrical wire (not shown) as is conventionally known in the wire termination art. Also as is conventionally known, nose 22 of tool 10 supports a first die set 28, which is provided for the crimping of non-insulated electrical terminals. Dies of this configuration have long been used in combination with pliers-type hand tools.

At a location closely adjacent to pivot pin 20, tool 10 includes a pair of opposed crimping dies 32 and 34 supported respectively by jaws 14 and 18. Opposed dies 32 and 34 are used to crimp an insulated electrical terminal (shown schematically in FIGS. 3 and 4) around the bared extent of an electrical wire (not shown). Crimping dies 32 and 34 together defined a crimping nest 30 which accommodates the insulated electrical terminal.

Figure 5:
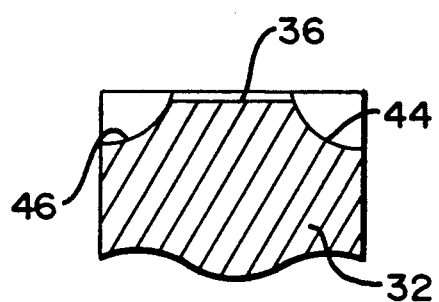
FIG. 5 is a sectional showing of the crimping die of FIG. 4 taken along lines V—V.
Figure 3:
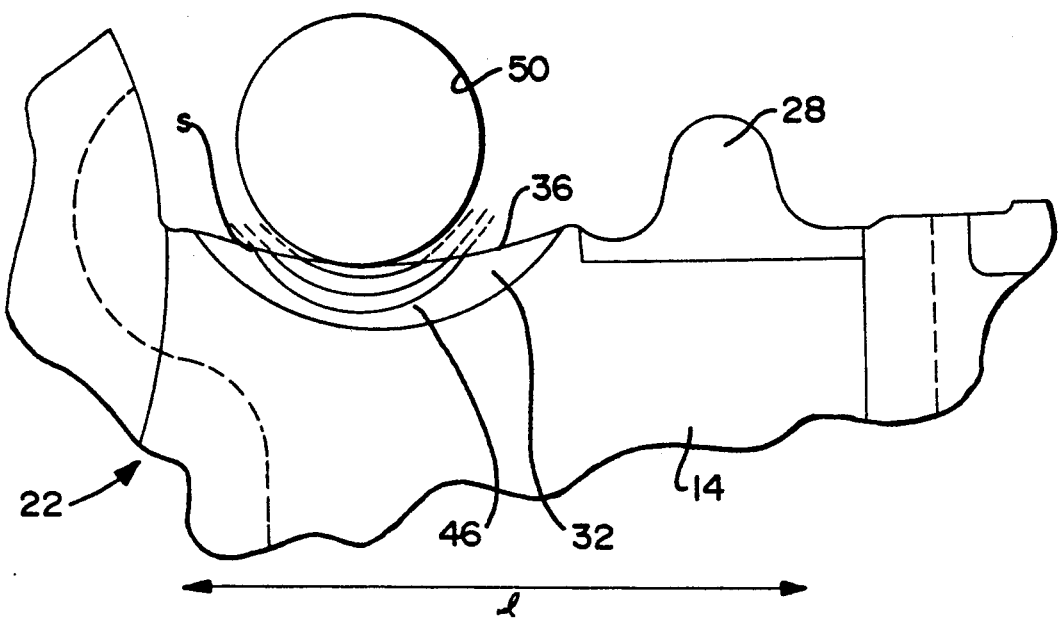
FIGS. 3 and 4 show respectively side and top an views of one crimping die of the tool shown in FIG. 1.
Figure 4:
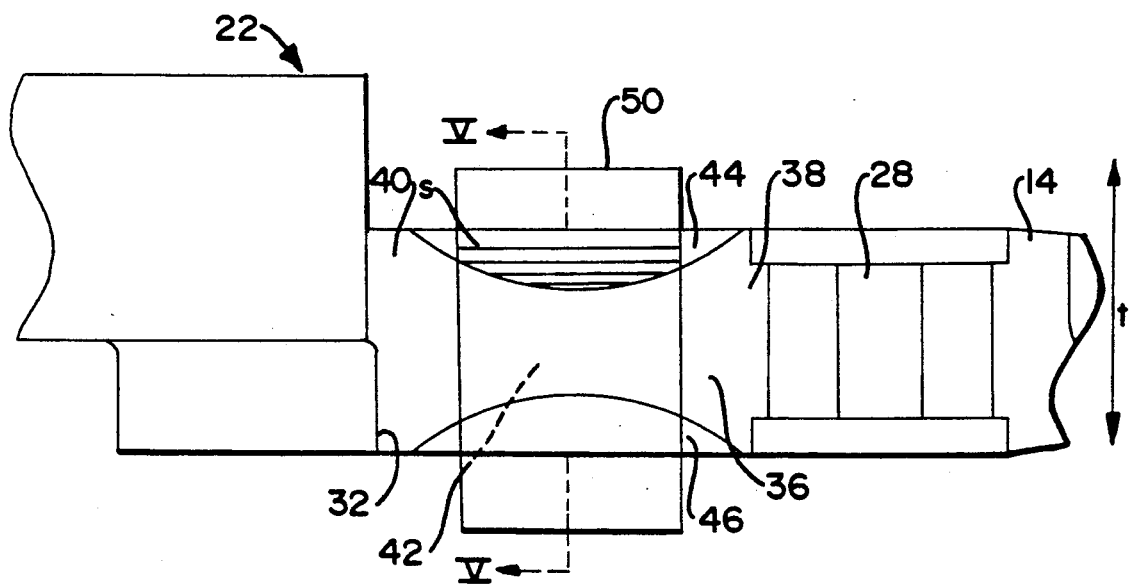

Referring to FIGS. 3, 4 and 5, the construction of crimping dies 32 and 34 and their operation may be described. The preferred embodiment of the present invention shown herein contemplates the use of identical crimping dies 32 and 34. Accordingly, FIGS. 3 through 5 for simplicity of description, show only one such crimping die 32. It is contemplated, however, that in addition to employing identical opposed crimping dies 32 and 34, one crimping die may be formed in accordance with the present invention, while the opposed die may be of conventional construction.

Referring to FIGS. 3, 4 and 5, crimping die 32 may be viewed as having a longitudinal extent l along the major axis of tool 10, as particularly shown in FIG. 3, and a transverse extent t perpendicular thereto as particularly shown in FIG. 4.

Crimping die 32 is concave in shape in its longitudinal direction and includes a raised crimping surface 36 shown more clearly in FIGS. 4 and 5. Raised crimping surface 36 has an hour-glass shape having relatively wide opposed longitudinal ends 38 and 40, and a relatively narrow central portion 42 therebetween. The hour-glass shape of crimping surface 36 is best seen in the top view in FIG. 4. Crimping die 32 further includes a pair of opposed side walls 44 and 46, which depend from raised crimping surface 36. Due to the hourglass configuration of raised crimping surface 36, opposed side walls 44 and 46 have curved extents in both the longitudinal and transverse direction. As shown in FIG. 4, side walls 44 and 46 curve inwardly in the longitudinal direction, forming the relatively narrow central portion 42 of raised crimping surface 36. In addition, as shown in FIG. 5, side walls 44 and 46 taper downwardly and outwardly from raised crimping surface 36. The taper of each of side walls 44 and 46 is curved in nature.

The particular shape of each of crimping dies 32 and 34 as shown in FIGS. 3 through 5, provides a pressure limiting effect during the manual crimping of an insulated terminal in nest 30. This pressure limiting effect allows an installer to apply sufficient manual force to crimp the terminal, while reducing the tendency to overcrimp.

Referring to FIGS. 3 and 4, an insulated electrical terminal 50 is shown schematically. Electrical terminal 50 is placed in nest 30 between crimping dies 32 and 34. A bared end extent of an electrical wire, (not shown), is inserted in a barrel portion of terminal 50 for crimping thereto. Manual actuation of handles 12 and 16 causes jaws 14 and 18 to move toward one another to crimp electrical terminal 50.

Initially, prior to the actual crimping, electrical terminal 50 sits on raised surface 36 of crimping die 32. The area of surface contact between die 32 and terminal 50 is limited to the narrow central portion 42 of raised surface 36. In fact, as the barrel portion of terminal 50 is typically circular in shape, terminal 50 would make tangential contact with raised surface 36. Upon crimping movement of dies 32 and 34, electrical terminal 50 is deformed and forced into progressive contact with raised surface 36 and tapered side walls 44 and 46. Accordingly, the actual area of surface contact between crimping die 32 and terminal 50 increases from contacting just the central portion 42 of raised crimping surface 36, to a surface area including a greater portion of raised crimping surface 36 as well as portions of each of tapered side walls 44 and 46. The increased area of contact is shown by line segments s in FIGS. 3 and 4. It can be seen that further crimping progressively increases the surface area contact between die 32 and terminal 50. Since mathematically, pressure P, force F and area A, have the following relationship: $P = F/A$, if the operator applies uniform force during crimping, the progressively increasing area of surface contact between terminal 50 and crimping die 32 will result in progressively decreasing pressure, thereby inhibiting overcrimping of electrical terminal 50. The operator typically has the ability to apply sufficient force to adequately crimp electrical terminal 50, thereby avoiding the problem of undercrimping, while also avoiding the problem of overcrimping by the pressure limiting effect of the particular shape of dies 30 and 32.

Various changes to the foregoing described and shown structures would now be evident to those skilled in the art. Accordingly, the particularly disclosed scope of the invention is set forth in the following claims.

I claim:

1. A tool for crimping an electrical terminal comprising:
    a first elongate handle having a first jaw at one end thereof;
    a second elongate handle having a second jaw at one end thereof; and
    pivot means movably coupling said first and second handles for movably positioning said first jaw adjacent said second jaw and thereby defining a crimping nest therebetween for receipt of an electrical terminal;
    one of said first and second jaws including a first crimping die adjacent said nest, said crimping die including a first raised elongate, longitudinally concave terminal crimping surface having depending curved tapered side walls extending therefrom and said terminal crimping surface defining an hour-glass configuration.

2. A tool in accordance with claim 1 wherein the other of said first and second jaws includes a second crimping die adjacent said nest and opposed to said first crimping die.

3. A tool in accordance with claim 2 wherein said second crimping die includes a second raised elongate, longitudinally concaved terminal crimping surface having opposed ends and a transversely inwardly narrowing central portion forming an hour-glass configuration.

4. A tool in accordance with claim 3 wherein said second crimping die includes depending tapered side walls extending from said second raised terminal crimping surface, said side walls of said second raised terminal crimping surface extending in a direction opposite said side walls of said first raised terminal crimping surface.

5. A tool for crimping an insulated electrical terminal comprising:
    a pair of opposed movable jaws for supporting and crimping said insulated terminal therebetween; and
    handle means for imparting said movement to said jaws;
    each jaw including an elongate crimping die for progressively engaging said terminal upon continued movement of said jaws, each said crimping die defining an area of surface contact with said terminal having longitudinal and transverse extents, said area of surface contact progressively transversely increasing along said longitudinal extent upon said continued movement of said jaws.

6. A tool in accordance with claim 5 wherein each said crimping die includes a raised surface and tapering side walls depending therefrom and wherein said area of surface contact includes said raised surface and said tapering side walls.

7. A tool in accordance with claim 6 wherein each said crimping die is concave.

8. A tool in accordance with claim 7 wherein each said raised surface is elongate having opposed ends and a transversely narrowing central portion forming an hour-glass configuration.

* * * * *